(12) United States Patent
Igarashi et al.

(10) Patent No.: US 7,705,680 B2
(45) Date of Patent: Apr. 27, 2010

(54) GAIN SWITCHING LOW-NOISE AMPLIFIER CIRCUIT

(75) Inventors: Yutaka Igarashi, Yokohama (JP); Akio Yamamoto, Hiratsuka (JP)

(73) Assignee: Renesas Technology Corp., Tokyo (JP)

( * ) Notice: Subject to any disclaimer, the term of this patent is extended or adjusted under 35 U.S.C. 154(b) by 9 days.

(21) Appl. No.: 12/102,321

(22) Filed: Apr. 14, 2008

(65) Prior Publication Data

US 2008/0309413 A1 Dec. 18, 2008

(30) Foreign Application Priority Data

Apr. 20, 2007 (JP) ............................. 2007-111537

(51) Int. Cl.
*H03G 3/10* (2006.01)
(52) U.S. Cl. ......................... 330/278; 330/51; 330/285
(58) Field of Classification Search .................. 330/51, 330/278, 285, 311
See application file for complete search history.

(56) References Cited

U.S. PATENT DOCUMENTS 6,392,487 B1 * 5/2002 Alexanian .................... 330/254
6,724,259 B2 * 4/2004 Tanabe ......................... 330/278

\* cited by examiner

*Primary Examiner*—Khanh V Nguyen
(74) *Attorney, Agent, or Firm*—Mattingly & Malur, P.C.

(57) ABSTRACT

In a gain switching LNA including a first transistor, a first transistor group (for example, second to ninth transistors) and a second transistor group (for example, tenth to seventeenth transistors), a first resistor connected between an emitter of the tenth transistor and a collector of the first transistor and a second resistor connected to emitters of eleventh to seventeenth transistors and the collector of the first transistor and having a resistance one seventh as high as that of the first resistor are provided. In a high-gain mode, since isolation of the tenth to seventeenth transistors which are turned OFF and the first and second to ninth transistors is secured by the first resistor and the second resistor, there is no deterioration in the noise factor.

5 Claims, 3 Drawing Sheets

GAIN SWITCHING LOW-NOISE AMPLIFIER CIRCUIT

CROSS-REFERENCE TO RELATED APPLICATION

The present application claims priority from Japanese Patent Application No. JP 2007-111537 filed on Apr. 20, 2007, the content of which is hereby incorporated by reference into this application.

TECHNICAL FIELD OF THE INVENTION

The present invention relates to a technology for an amplifier circuit. More particularly, it relates to a technology effectively applied to a low-noise amplifier circuit having a gain switching function and required to have a small ratio between a signal-to-noise ratio at an input of an amplifier circuit and a signal-to-noise ratio at an output of the amplifier circuit.

BACKGROUND OF THE INVENTION

According to the studies by the inventors of the present invention, a circuit receiving a radio signal (hereinafter, referred to as a receiver) is a circuit which performs frequency conversion to a lower frequency and amplification to a desired level without reducing a signal-to-noise ratio (hereinafter, abbreviated to SNR) of the signal inputted from an antenna and distorting the signal as far as possible. For this reason, the receiver is provided with a low-noise amplifier circuit (hereinafter, referred to as LNA) disposed at a position as close as possible to an antenna.

The LNA is required to have such features as (1) high gain, (2) a ratio between a signal-to-noise ratio at an LNA input and a signal-to-noise ratio at an LNA output (hereinafter, referred to as a noise factor) is small, and (3) low distortion. Further, since an efficient power transfer is necessary in order to receive a weak radio signal inputted from an antenna, the LNA is required to have (4) impedance matching between the input and the output.

However, since a mixer, an amplifier circuit and others are provided on a latter stages of the LNA in a receiver, when a strong input signal is inputted from an antenna, if the gain of the LNA is high [(1) mentioned above], the signal is distorted in the mixer, the amplification circuit and others on the latter stages, and the desired receiving operation cannot be performed. Therefore, the LNA is also required to perform the gain switching operation in general.

SUMMARY OF THE INVENTION

As to the LNA mentioned above, FIG. 3 shows a circuit diagram of a gain switching LNA which the inventors of the present invention have examined as a premise of the present invention. The gain switching LNA is configured of an input terminal LNAin, an output terminal LNAout, a gain switching control terminal GainCtrl, bias circuits 10 and 20, a DC power source 30, resistors R1 to R3, capacitors C1 and C2, inductors L1 and L2, switches SW1 and SW2, transistors Q1, Q11 to Q18 and Q21 to Q28, and others. In FIG. 3, the transistors Q11 to Q18 and Q21 to Q28 are designed to have the same size, the same shape, and the same characteristics, and DC bias voltage is supplied thereto by the bias circuits 10 and 20 so that the transistors operate properly. More specifically, the DC power source 30 is positive voltage, and it is assumed that "base voltage of transistors Q11 to Q18 and Q21 to Q28>base voltage of transistor Q1" is satisfied. Further, in FIG. 3, it is assumed that the capacitors C1 and C2 have sufficiently low impedance at a desired signal frequency of the gain switching LNA in FIG. 3.

The gain switching LNA in FIG. 3 has a high-gain mode and a low-gain mode. The operation thereof will be described below.

When the gain switching control terminal GainCtrl is at High voltage (high-gain mode), the switch SW1 connects the resistor R2 to the bias circuit 20, and the switch SW2 connects the resistor R3 to a collector of the transistor Q1. At this time, eight transistors Q11 to Q18 are turned ON and eight transistors Q21 to Q28 are turned OFF. The collector current of the transistor Q1 flows to the eight transistors Q11 to Q18.

When the gain switching control terminal GainCtrl is at Low voltage (low-gain mode), the switch SW1 connects the resistor R2 to the collector of the transistor Q1, and the switch SW2 connects the resistor R3 to the bias circuit 20. At this time, the eight transistors Q11 to Q18 are turned OFF and the eight transistors Q21 to Q28 are turned ON. The collector current of the transistor Q1 is equally distributed and flows to the eight transistors Q21 to Q28.

Since radio signal voltage inputted from the input terminal LNAin changes the base bias voltage (direct current) of the transistor Q1, the collector current of the transistor Q1 changes. Further, the emitter voltage of the transistor Q1 changes in almost the same manner as the base voltage of the transistor Q1. If the base-emitter voltage of a transistor is defined as VBE1, "base voltage of transistor Q1=emitter voltage of transistor Q1+VBE1" is satisfied. If the DC voltage components are subtracted from both sides, "base voltage change of transistor Q1≈emitter voltage change of transistor Q1" is obtained. The inductor L2 is inserted so as to apply the negative feedback to improve the distortion characteristic of the LNA. At this time, "emitter voltage change of transistor Q1=L2×d(emitter current change of transistor Q1)/d (time)≈L2×d(collector current change of transistor Q1)/d (time)≈base voltage change of transistor Q1" is obtained.

In the high-gain mode, the collector current of the transistor Q1 flows to the eight transistors Q11 to Q18 and the eight transistors Q21 to Q28 are turned OFF for the reason mentioned above. Therefore, the current equal to the collector current of the transistor Q1 flows to the inductor L1. At this time, "collector voltage change of transistors Q11 to Q18=L1×d(collector current change of transistors Q11 to Q18)/d (time)=L1×d(collector current change of transistor Q1)/d (time)" is satisfied. Therefore, "gain of LNA in high-gain mode=collector voltage change of transistors Q11 to Q18/base voltage change of transistor Q1≈L1/L2" can be expressed.

In the low-gain mode, the collector current of the transistor Q1 flows to the eight transistors Q21 to Q28, and the eight transistors Q11 to Q18 are turned OFF. Since the transistors Q11 to Q18 and Q21 to Q28 have the same size, the same shape, and the same characteristics, current equal to one eighth of the collector current of the transistor Q1 flows to the inductor L1. At this time, "collector voltage change of transistor Q21=L1×d(collector current change of transistor Q21)/d (time)=L1×d(collector current change of transistor Q1)/d (time)/8" is satisfied. Therefore, "gain of LNA in low-gain mode=collector voltage change of transistor Q21/base voltage change of transistor Q1≈L1/L2/8" can be expressed. In other words, the gain difference between the high-gain mode and the low-gain mode is one-eighth, and the gain switching step width of about 18 dB can be realized. Although eight transistors Q11 and Q18 and eight transistors Q21 to Q28 are exemplified in the description of FIG. 3, if the numbers of transistors are changed to other numbers, the gain switching step width with an arbitrary integer ratio can be realized.

In the gain switching LNA in FIG. 3, however, the small noise factor is required particularly when the gain switching control terminal GainCtrl is at High voltage, but there occurs the problem that the noise factor is deteriorated due to the influence of the transistors Q21 to Q28 that are in an OFF state.

Then, an object of the present invention is to provide a gain switching LNA capable of solving the above-described problem and suppressing the deterioration of a noise factor.

The above and other objects and novel characteristics of the present invention will be apparent from the description of this specification and the accompanying drawings.

The typical ones of the inventions disclosed in this application will be briefly described as follows.

For the achievement of the object above, the gain switching LNA according to the present invention is configured as follows.

A gain switching low-noise amplifier circuit according to the present invention comprises: an input terminal of an RF signal; a transistor C having a base to which a signal from the input terminal is inputted; a first bias circuit connected to the base of the transistor C via a resistor and turning ON the transistor C; a first transistor group including transistors A1 to AN (N is a natural number of 2 or more) and a second transistor group including transistors B1 to BN, the transistors having the same size, the same shape, and the same characteristics; a first capacitor and a second capacitor connected to each base of the transistors of the first transistor group and the second transistor group, respectively, and short-circuited to ground at a frequency band of the RF signal in an AC manner; a first resistor and a second resistor connected to each base of the transistors of the first transistor group and the second resistor group, respectively; a second bias circuit which turns ON the first transistor group and the second transistor group via the first resistor and the second resistor, respectively; an inductor connected between collectors of N pieces of transistors from A1 to AN of the first transistor group and X pieces of transistors from B1 to BX (X is a natural number smaller than N) of the second transistor group and a DC power source; a first switch which short-circuits between bases and emitters of the transistors of the first transistor group via the first resistor or connects the first transistor group to the second bias circuit; a second switch which short-circuits between bases and emitters of the transistors of the second transistor group via the second resistor or connects the second transistor group to the second bias circuit; a gain switching control terminal which exclusively turns ON/OFF the first switch and the second switch; and an output terminal connected to collectors of the transistors of the first transistor group, wherein collectors of N-X pieces of transistors from BX+1 to BN of the second transistor group are connected to the DC power source, emitters of the transistors A1 to AN of the first transistor group are short-circuited and connected to a collector of the transistor C, emitters of X pieces of transistors from B1 to BX of the second transistor group are short-circuited and connected, and emitters of N-X pieces of transistors from BX+1 to BN of the second transistor group are short-circuited and connected, and the gain switching low-noise amplifier circuit further comprises: a resistor B1 connected between emitters of X pieces of transistors from B1 to BX of the second transistor group and the collector of the transistor C; and a resistor B2 connected between emitters of N-X pieces of transistors from BX+1 to BN of the second transistor group and the collector of the transistor C and having a resistance X/(N-X) times as high as that of the resistor B1.

Also, a gain switching low-noise amplifier circuit according to the present invention comprises: an input terminal; a voltage-input current-output amplifier which inputs a voltage signal inputted from the input terminal and outputs a current signal; a first current-input current-output amplifier, a second current-input current-output amplifier, and a third current-input current-output amplifier, which input a current signal and output a current signal; a first switch, a second switch, and a third switch; a gain switching control terminal; a current-voltage converter which converts an added value of output current signals of the first current-input current-output amplifier and the second current-input current-output amplifier into a voltage signal; and an output terminal which outputs output voltage of the current-voltage converter, wherein the gain switching low-noise amplifier circuit further comprises: a first resistor and a second resistor having a resistance ratio of N-X:N, when a signal from the gain switching control terminal is a high-gain mode, a current output of the voltage-input current-output amplifier is inputted to a current input terminal of the first current-input current-output amplifier via the first switch, when the signal from the gain switching control terminal is a low-gain mode, current X/N times as large as the current output of the voltage-input current-output amplifier is inputted to the second switch via the first resistor and further inputted to a current input terminal of the second current-input current-output amplifier disposed on a latter stage, and also when the signal from the gain switching control terminal is a low-gain mode, current (N-X)/N times as large as the current output of the voltage-input current-output amplifier is inputted to the third switch via the second resistor and further inputted to a current input terminal of the third current-input current-output amplifier disposed on a latter stage.

The effects obtained by typical aspects of the present invention will be briefly described below.

According to the present invention, the gain switching LNA capable of suppressing the deterioration of a noise factor can be provided.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiment, and the repetitive description thereof will be omitted.

First Embodiment

Figure 1:
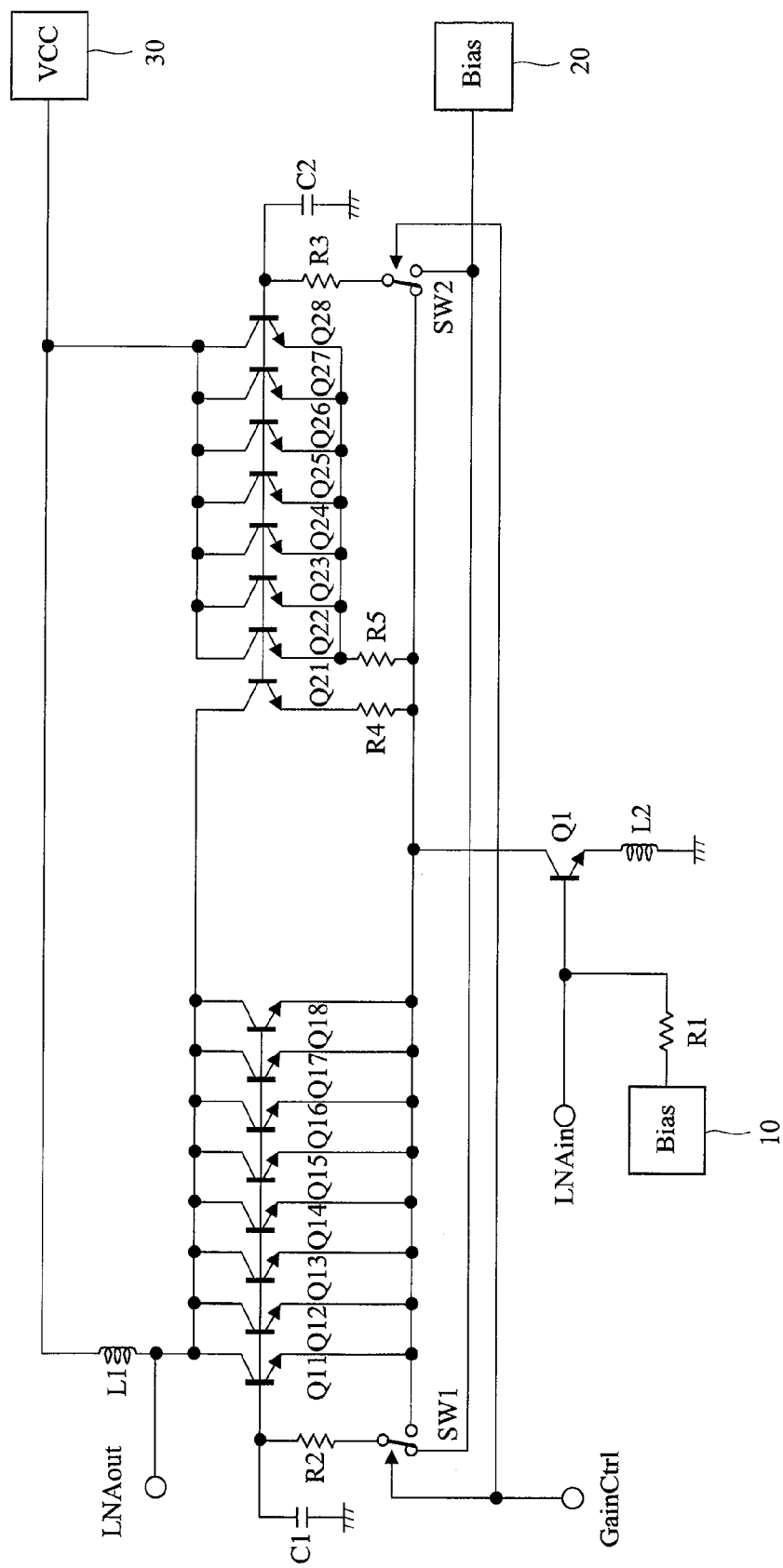
FIG. 1 is a circuit diagram showing a gain switching LNA according to a first embodiment of the present invention.

FIG. 1 is a circuit diagram showing a gain switching LNA according to a first embodiment of the present invention. The gain switching LNA according to this embodiment includes an input terminal LNAin, an output terminal LNAout, a gain switching control terminal GainCtrl, bias circuits 10 and 20, a DC power source 30, resistors R1 to R5, capacitors C1 and C2, inductors L1 and L2, switches SW1 and SW2, transistors Q1, Q11 to Q18 and Q21 to Q28, and others.

More specifically, the gain switching LNA according to this embodiment is configured of: the input terminal LNAin of an RF signal; the transistor Q1 having a base to which the signal from the input terminal LNAin is inputted; the bias circuit 10 which is connected to the base of the transistor Q1 via the resistor R1 and turns ON the transistor Q1; a first transistor group including a plurality of transistors (eight transistors in FIG. 1); a second transistor group including a plurality of transistors (eight transistors in FIG. 1); the capacitor C1 connected to each base of the transistors of the first transistor group and short-circuited to the ground at a frequency band of the RF signal in an AC manner; the capacitor C2 connected to each base of the transistors of the second transistor group and short-circuited to the ground at a frequency band of the RF signal in an AC manner; the resistors R2 and R3 connected to each base of the transistors of the first transistor group and the second transistor group, respectively; the bias circuit 20 which turns ON the first transistor group and the second transistor group via the resistor R2 and the resistor R3, respectively; the transistors Q11 to Q18 of the first transistor group; the inductor L1 connected between a collector of, for example, one transistor Q21 of the second transistor group and the DC power source 30; the switch SW1 which short-circuits between bases and emitters of the transistors of the first transistor group via the resistor R2 or connects the first transistor group to the bias circuit 20; the switch SW2 which short-circuits between bases and emitters of the transistors of the second transistor group via the resistor R3 or connects the second transistor group to the bias circuit 20; the gain switching control terminal GainCtrl which exclusively turns ON/OFF the switches SW1 and SW2; and the output terminal LNAout connected to the collectors of the transistors of the first transistor group.

Further, the collectors of the seven transistors Q22 to Q28 of the second transistor group are connected to the DC power source 30, and the emitters of the transistors Q11 to Q18 of the first transistor group are short-circuited and connected to the collector of the transistor Q1. Also, the emitter of the transistor Q21 of the second transistor group is connected to the resistor R4, and the emitters of the transistors Q22 to Q28 of the second transistor group are short-circuited and connected to the resistor R5.

In particular, in this embodiment, the configuration of the gain switching LNA described above is provided with the resistor R4 connected between the emitter of the transistor Q21 of the second transistor group and the collector of the transistor Q1 and the resistor R5 connected between the emitters of transistors Q22 to Q28 of the second transistor group and the collector of the transistor Q1 and having the resistance one-seventh as high as that of the resistor R4.

It is assumed in the gain switching LNA according to this embodiment that the transistors Q11 to Q18 and Q21 to Q28 have the same size, the same shape, and the same characteristics, and the DC bias voltage is supplied thereto by the bias circuits 10 and 20 so that the transistors operate properly. In other words, the DC power source 30 is positive voltage, and "base voltage of transistors Q11 to Q18 and Q21 to Q28>base voltage of transistor Q1" is satisfied. Further, it is assumed that the capacitors C1 and C2 have sufficiently low impedance at a desired signal frequency of the gain switching LNA in FIG. 1, and "resistance value of R4=7×resistance value of R5" is satisfied.

The gain switching LNA in FIG. 1 has a high-gain mode and a low-gain mode. The operation thereof will be described below.

When the gain switching control terminal GainCtrl is at High voltage (high-gain mode), the switch SW1 connects the resistor R2 to the bias circuit 20, and the switch SW2 connects the resistor R3 to the collector of the transistor Q1. At this time, the eight transistors Q11 to Q18 are turned ON and the eight transistors Q21 to Q28 are turned OFF. The collector current of the transistor Q1 flows to the eight transistors Q11 to Q18.

When the gain switching control terminal GainCtrl is at Low voltage (low-gain mode), the switch SW1 connects the resistor R2 to the collector of the transistor Q1, and the switch SW2 connects the resistor R3 to the bias circuit 20. At this time, the eight transistors Q11 to Q18 are turned OFF and the eight transistors Q21 to Q28 are turned ON. Since "resistance of R4=7×resistance of R5" is satisfied, the collector current of the transistor Q1 is equally distributed and flows to the eight transistors Q21 to Q28.

Since radio signal voltage inputted from the input terminal LNAin changes the base bias voltage (direct current) of the transistor Q1, the collector current of the transistor Q1 changes. Further, the emitter voltage of the transistor Q1 changes in almost the same manner as the base voltage of the transistor Q1. If the base-emitter voltage of a transistor is defined as VBE1, "base voltage of transistor Q1=emitter voltage of transistor Q1+VBE1" is satisfied. If the DC voltage components are subtracted from both sides, "base voltage change of transistor Q1≈emitter voltage change of transistor Q1" is obtained. The inductor L2 is inserted so as to apply the negative feedback to improve the distortion characteristic of the LNA. At this time, "emitter voltage change of transistor Q1=L2×d(emitter current change of transistor Q1)/d (time) ≈L2×d(collector current change of transistor Q1)/d (time) ≈base voltage change of transistor Q1" is obtained.

In the high-gain mode, the collector current of the transistor Q1 flows to the eight transistors Q11 to Q18 and the eight transistors Q21 to Q28 are turned OFF for the reason mentioned above. Therefore, the current equal to the collector current of the transistor Q1 flows to the inductor L1. At this time, "collector voltage change of transistors Q11 to Q18=L1×d(collector current change of transistors Q11 to Q18)/d (time)=L1×d(collector current change of transistor Q1)/d (time)" is satisfied. Therefore, "gain of LNA in high-gain mode=collector voltage change of transistors Q11 to Q18/base voltage change of transistor Q1≈L1/L2" can be expressed.

In the low-gain mode, the collector current of the transistor Q1 flows to the eight transistors Q21 to Q28, and the eight transistors Q11 to Q18 are turned OFF. Since the transistors Q11 to Q28 have the same size, the same shape, and the same characteristics, current equal to one eighth of the collector current of the transistor Q1 flows to the inductor L1. At this time, "collector voltage change of transistor Q21=L1×d(collector current change of transistor Q21)/d (time)=L1×d(collector current change of transistor Q1)/d (time)/8" is satisfied. Therefore, "gain of LNA in low-gain mode=collector voltage change of transistor Q21/base voltage change of transistor Q1≈L1/L2/8" can be expressed.

Figure 3:
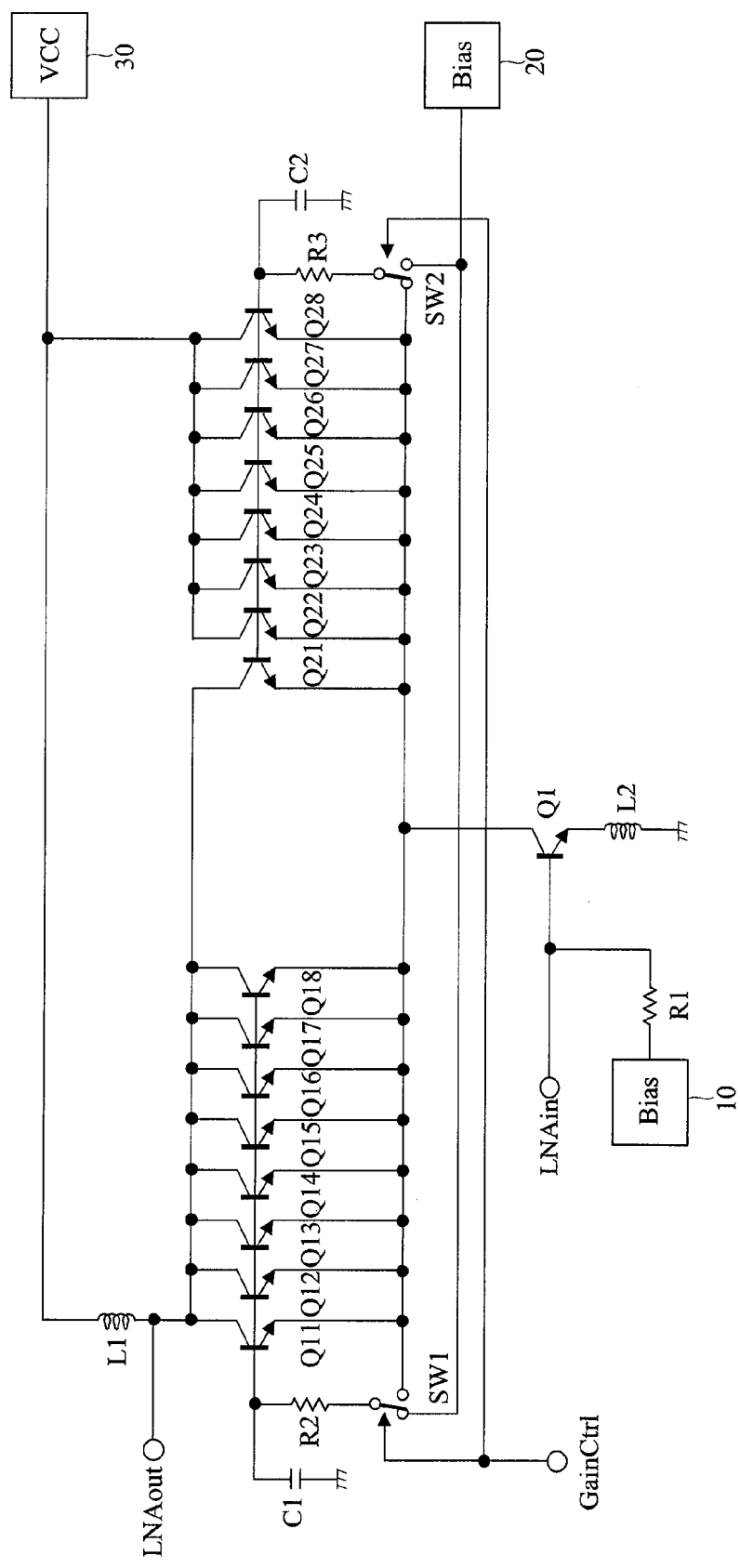
FIG. 3 is a circuit diagram showing a gain switching LNA examined as a premise of the present invention.

In other words, the gain difference between the high-gain mode and the low-gain mode is one-eighth, and the gain switching step width of about 18 dB can be realized. Although eight transistors Q11 to Q18 and eight transistors Q21 to Q28 are exemplified in the description of FIG. 1, if the numbers of transistors are changed to other numbers, the gain switching step width with an arbitrary integer ratio can be realized. More specifically, with regard to the gain switching operation, the gain switching LNA in FIG. 1 has the same function as that of the gain switching LNA in FIG. 3. At the same time, since the isolation of the transistors Q21 to Q28 which are being turned OFF and the transistors Q1 and Q11 to Q18 is secured by the resistor R4 and the resistor R5 in the high-gain mode, there is no deterioration in the noise factor.

Further, even though the transistors Q1, Q11 to Q18, and Q21 to Q28 of FIG. 1 are directly replaced with field effect transistors (MOSFET (Metal Oxide Semiconductor Field Effect Transistor)), the same effects can be achieved.

Second Embodiment

Figure 2:
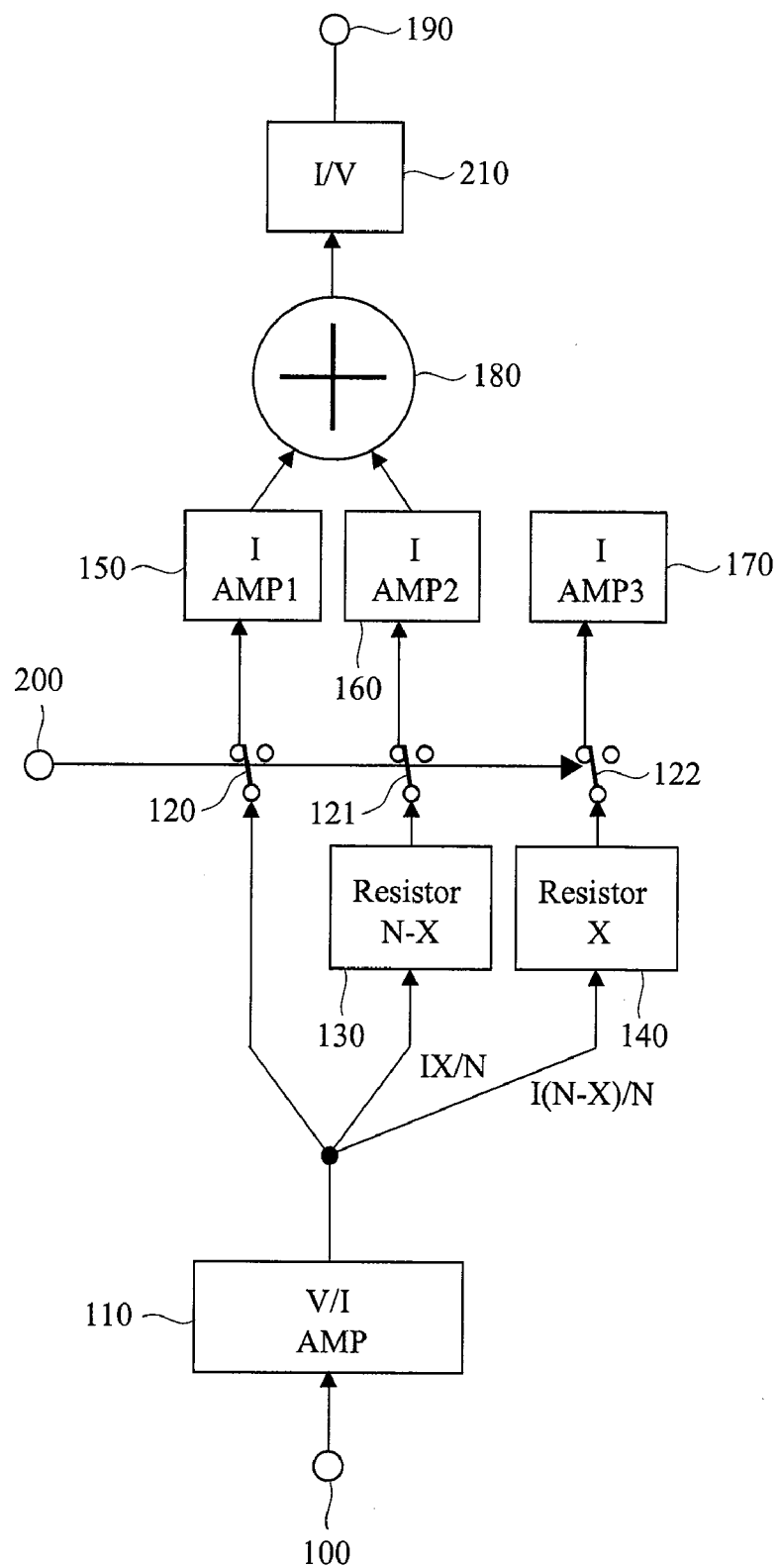
FIG. 2 is a block diagram showing a gain switching LNA according to a second embodiment of the present invention.

FIG. 2 is a block diagram showing a gain switching LNA of a second embodiment of the present invention. The gain switching LNA according to this embodiment is configured of an input terminal 100, a voltage-input current-output amplifier 110, switches 120, 121 and 122, resistors 130 and 140, current-input current-output amplifiers 150, 160 and 170, a current adder 180, an output terminal 190, a gain switching control terminal 200, a current-voltage converter 210, and others.

More specifically, the gain switching LNA according to this embodiment includes: the input terminal 100; the voltage-input current-output amplifier 110 which inputs a voltage signal inputted from the input terminal 100 and outputs a current signal; the current-input current-output amplifiers 150, 160 and 170 which input a current signal and outputs a current signal; the switches 120, 121 and 122; the gain switching control terminal 200; the current-voltage converter 210 which converts an added value of output current signals of the current-input current-output amplifiers 150 and 160 into a voltage signal; and the output terminal 190 which outputs the output voltage of the current-voltage converter 210.

For example, the voltage-input current-output amplifier 110 can be configured to include the transistor Q1 in the first embodiment. Further, the current-input current-output amplifiers 150 can be configured to include the transistors Q11 to Q18 in the first embodiment. Similarly, the current-input current-output amplifier 160 can be configured to include the transistor Q21 and the current-input current-output amplifier 170 can be configured to include the transistors Q22 to Q28. Moreover, the current-voltage converter 210 can be configured to include the inductor L1 in the first embodiment.

In particular, in this embodiment, the gain switching LNA is configured to include the resistors 130 and 140 having the resistance ratio of N–X:N. Also, when the signal from the gain switching control terminal 200 is the high-gain mode, the current output of the voltage-input current-output amplifier 110 is inputted to the current input terminal of the current-input current-output amplifier 150 via the switch 120. Further, when the signal from the gain switching control terminal 200 is the low-gain mode, the current X/N times the current output of the current-input current-output amplifier 110 is inputted to the switch 121 via the resistor 130 and is further inputted to the current input terminal of the current-input current-output amplifier 160 disposed on the latter stage. Moreover, when the signal from the gain switching control terminal 200 is the low-gain mode, the current (N–X)/N times the current output of voltage-input current-output amplifier 110 is inputted to the switch 122 via the resistor 140 and is further inputted to the current input terminal of the current-input current-output amplifier 170 disposed on the latter stage.

In the gain switching LNA according to this embodiment, the voltage signal inputted from the input terminal 100 is converted into current by the voltage-input current-output amplifier 110.

By the control signal from the gain switching control terminal 200, the switches 120 to 122 switch the current output of the voltage-input current-output amplifier 110 toward the current-input current-output amplifier 150 in the high-gain mode and toward the resistors 130 and 140 in the low-gain mode.

When the control signal from the gain switching control terminal 200 is the high-gain mode, the current output of the voltage-input current-output amplifier 110 is inputted to the current-input current-output amplifier 150 via the switch 120.

When the control signal from the gain switching control terminal 200 is the low-gain mode, the current output of the voltage-input current-output amplifier 110 is inputted to the resistors 130 and 140 with the ratio of X:(N–X). For its achievement, the resistance ratio of the resistors 130 and 140 needs to be (N–X):X.

The current output of the voltage-input current-output amplifier 110 which has become X/N times through the resistor 130 is inputted to the current-input current-output amplifier 160 via the switch 121, and the current output of the voltage-input current-output amplifier 110 which has become (N–X)/N times through the resistor 140 is inputted to the current-input current-output amplifier 170 via the switch 122.

The output current of the current-input current-output amplifier 150 and the output current of the current-input current-output amplifier 160 are inputted to the current adder 180 and then added. The output current of the current adder 180 is again converted into voltage by the current-voltage converter 210 and is outputted from the output terminal 190.

When the control signal from the gain switching control terminal 200 is the low-gain mode, since the output current of the current-input current-output amplifier 170 does not contribute to the output voltage of the current-voltage converter 210, the signal can be attenuated, and the low-gain mode of the gain switching LNA in FIG. 2 can be realized.

When the control signal from the gain switching control terminal 200 is the high-gain mode, since the output current of the current-input current-output amplifier 160 does not contribute to the output voltage of the current-voltage converter 210, the high-gain mode of the gain switching LNA in FIG. 2 can be realized. Simultaneously, even when the isolation by the switches 121 and 122 is insufficient, the effect of the current-input current-output amplifiers 160 and 170 seen from the voltage-input current-output amplifier 110 can be increased by the resistors 130 and 140. Accordingly, the deterioration of the noise factor in the high-gain mode can be suppressed.

In the foregoing, the invention made by the inventors of the present invention has been concretely described based on the embodiments. However, it is needless to say that the present invention is not limited to the foregoing embodiments and various modifications and alterations can be made within the scope of the present invention.

The amplifier circuit of present invention can be used for a low-noise amplifier circuit having a gain switching function and required to have a small ratio between a signal-to-noise ratio at an input of an amplifier circuit and a signal-to-noise ratio at an output of the amplifier circuit.

What is claimed is:

1. A gain switching low-noise amplifier circuit, comprising:
    an input terminal of an RF signal;
    a transistor C having a base to which a signal from the input terminal is inputted;
    a first bias circuit connected to the base of the transistor C via a resistor and turning ON the transistor C;
    a first transistor group including transistors A1 to AN (where N is a natural number of 2 or more) and a second transistor group including transistors B1 to BN, the transistors having same size, same shape, and same characteristics;

a first capacitor and a second capacitor connected to each base of the transistors of the first transistor group and the second transistor group, respectively, and short-circuited to ground at a frequency band of the RF signal in an AC manner;

a first resistor and a second resistor connected to each base of the transistors of the first transistor group and the second resistor group, respectively;

a second bias circuit which turns ON the first transistor group and the second transistor group via the first resistor and the second resistor, respectively;

an inductor connected between collectors of N pieces of transistors from A1 to AN of the first transistor group and X pieces of transistors from B1 to BX (wherein X is a natural number smaller than N) of the second transistor group and a DC power source;

a first switch which short-circuits between bases and emitters of the transistors of the first transistor group via the first resistor or connects the first transistor group to the second bias circuit;

a second switch which short-circuits between bases and emitters of the transistors of the second transistor group via the second resistor or connects the second transistor group to the second bias circuit;

a gain switching control terminal which exclusively turns ON/OFF the first switch and the second switch; and an output terminal connected to collectors of the transistors of the first transistor group, wherein collectors of N−X pieces of transistors from BX+1 to BN of the second transistor group are connected to the DC power source, wherein emitters of the transistors A1 to AN of the first transistor group are short-circuited and connected to a collector of the transistor C, wherein emitters of X pieces of transistors from B1 to BX of the second transistor group are short-circuited and connected, and wherein emitters of N−X pieces of transistors from BX+1 to BN of the second transistor group are short-circuited and connected, the gain switching low-noise amplifier circuit further comprising:

a resistor B1 connected between emitters of X pieces of transistors from B1 to BX of the second transistor group and the collector of the transistor C; and a resistor B2 connected between emitters of N−X pieces of transistors from BX+1 to BN of the second transistor group and the collector of the transistor C and having a resistance X/(N−X) times as high as that of the resistor B1.

2. A gain switching low-noise amplifier circuit, comprising:

an input terminal;

a voltage-input current-output amplifier which inputs a voltage signal inputted from the input terminal and outputs a current signal;

a first current-input current-output amplifier, a second current-input current-output amplifier, and a third current-input current-output amplifier, which input a current signal and output a current signal;

a first switch, a second switch, and a third switch;

a gain switching control terminal;

a current-voltage converter which converts an added value of output current signals of the first current-input current-output amplifier and the second current-input current-output amplifier into a voltage signal; and an output terminal which outputs output voltage of the current-voltage converter, wherein N is a natural number of 2 or more and X is a natural number smaller than N, wherein the gain switching low-noise amplifier circuit further comprises: a first resistor and a second resistor having a resistance ratio of (N−X):N, wherein when a signal from the gain switching control terminal is a high-gain mode, a current output of the voltage-input current-output amplifier is inputted to a current input terminal of the first current-input current-output amplifier via the first switch, wherein when the signal from the gain switching control terminal is a low-gain mode, current X/N times as large as the current output of the voltage-input current-output amplifier is inputted to the second switch via the first resistor and further inputted to a current input terminal of the second current-input current-output amplifier disposed on a latter stage, and wherein also when the signal from the gain switching control terminal is a low-gain mode, current (N−X):N times as large as the current output of the voltage-input current-output amplifier is inputted to the third switch via the second resistor and further inputted to a current input terminal of the third current-input current-output amplifier disposed on a latter stage.

3. The gain switching low-noise amplifier circuit according to claim 2, wherein the voltage-input current-output amplifier includes a transistor C having a base to which a signal from the input terminal is inputted.

4. The gain switching low-noise amplifier circuit according to claim 3, wherein the first current-input current-output amplifier includes a first transistor group including transistors A1 to AN (N is a natural number of 2 or more) having same size, same shape, and same characteristics, wherein the second current-input current-output amplifier includes X pieces of transistors from B1 to BX (X is a natural number smaller than N) of a second transistor group including transistors B1 to BN having same size, same shape, same characteristics, and wherein the third current-input current-output amplifier includes N−X pieces of transistors from BX+1 to BN of the second transistor group.

5. The gain switching low-noise amplifier circuit according to claim 4, wherein the current-voltage converter includes an inductor connected between N pieces of transistors from A1 to AN of the first transistor group and X pieces of transistors from B1 to BX of the second transistor group and a DC power source.

* * * * *